US008502339B2

(12) United States Patent
Lin et al.

(10) Patent No.: US 8,502,339 B2
(45) Date of Patent: Aug. 6, 2013

(54) SYSTEM-IN-PACKAGE HAVING INTEGRATED PASSIVE DEVICES AND METHOD THEREFOR

(75) Inventors: Yaojian Lin, Singapore (SG); Robert C. Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 85 days.

(21) Appl. No.: 12/813,315

(22) Filed: Jun. 10, 2010

(65) Prior Publication Data

US 2010/0244193 A1 Sep. 30, 2010

Related U.S. Application Data

(63) Continuation of application No. 11/964,529, filed on Dec. 26, 2007, now Pat. No. 7,759,212.

(51) Int. Cl.
*H01L 21/02* (2006.01)
(52) U.S. Cl.
USPC ............... 257/532; 29/852; 29/846; 29/832; 29/841
(58) Field of Classification Search
USPC ............... 257/528, 532; 29/852, 846, 832, 29/841
See application file for complete search history.

(56) References Cited

U.S. PATENT DOCUMENTS

| | | |
|---|---|---|
| 5,250,843 A | 10/1993 | Eichelberger |
| 5,353,498 A | 10/1994 | Fillion et al. |
| 5,689,138 A | 11/1997 | Dekker et al. |
| 5,841,193 A * | 11/1998 | Eichelberger ............... 257/723 |
| 6,876,056 B2 | 4/2005 | Tilmans et al. |
| 6,889,155 B2 | 5/2005 | Ogino et al. |
| 7,165,316 B2 | 1/2007 | Fjelstad |
| 7,244,656 B2 * | 7/2007 | Ogawa ......................... 438/384 |
| 7,259,077 B2 | 8/2007 | Degani et al. |
| 7,619,901 B2 | 11/2009 | Eichelberger et al. |
| 2005/0195891 A1 | 9/2005 | Ogino et al. |
| 2005/0253255 A1 | 11/2005 | Degani et al. |
| 2006/0217102 A1 | 9/2006 | Degani et al. |
| 2007/0065964 A1 | 3/2007 | Degani |
| 2007/0114634 A1 | 5/2007 | Lin et al. |
| 2007/0114651 A1 | 5/2007 | Marimuthu et al. |
| 2007/0176287 A1 | 8/2007 | Crowley et al. |
| 2007/0235878 A1 | 10/2007 | Lin et al. |
| 2008/0315418 A1 | 12/2008 | Boyd et al. |

* cited by examiner

*Primary Examiner* — Jenny L Wagner
(74) *Attorney, Agent, or Firm* — Robert D. Atkins; Patent Law Group: Atkins & Associates, P.C.

(57) ABSTRACT

A semiconductor device has a substrate, first passivation layer formed over the substrate, and integrated passive device formed over the substrate. The integrated passive device can include an inductor, capacitor, and resistor. A second passivation layer is formed over the integrated passive device. System components are mounted to the second passivation layer and electrically connect to the second conductive layer. A mold compound is formed over the integrated passive device. A coefficient of thermal expansion of the mold compound is approximately equal to a coefficient of thermal expansion of the system component. The substrate is removed. An opening is etched into the first passivation layer and solder bumps are deposited over the opening in the first passivation layer to electrically connect to the integrated passive device. A metal layer can be formed over the molding compound or first passivation layer for shielding.

35 Claims, 8 Drawing Sheets

SYSTEM-IN-PACKAGE HAVING INTEGRATED PASSIVE DEVICES AND METHOD THEREFOR

CLAIM TO DOMESTIC PRIORITY

The present application is a continuation of U.S. patent application Ser. No. 11/964,529, now U.S. Pat. No. 7,759,212, filed Dec. 26, 2007, and claims priority to the foregoing parent application pursuant to 35 U.S.C. §120.

FIELD OF THE INVENTION

The present invention relates in general to semiconductor devices and, more particularly, to an apparatus and method of fabricating a system in a package (SiP) having integrated passive devices (IPDs).

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As electrical devices become increasingly miniaturized, integrated circuit (IC) manufacturing techniques are used to form traditional electrical circuit components such as capacitors, resistors, inductors, filters, and interconnects directly upon a silicon or silicon-like substrate. For example, many of the devices in today's portable wireless products are passive components, and the integration of passive components into a substrate can provide significant performance, cost, and size advantages. Similarly, the integration of IC chips such as memory and logic devices into a substrate or a connected device provides additional benefit as it too minimizes manufacturing costs while increasing performance.

Although preferable, the integration of several passive devices formed on a wafer with other chips and packages can present many challenges. Today's manufacturing processes require the use of expensive, specialty substrate materials when forming SiP devices having IPDs. Further, if the device combines semiconductor components manufactured using thin-film processes and printed circuit board (PCB) components, the manufacturing process may be subject to significant temperature limitations that increase the difficulty and cost of manufacture. Also, in today's SiP devices, any connected IC chips are generally limited to a 2D layout configuration. As a result, the number of IC chips that can be coupled directly to a substrate is greatly limited in accordance with the geometry of the substrate. If components or additional devices are mounted to a backside of a substrate using conventional technologies, it may be necessary to use through substrate vias (TSVs) to electrically connect the components to the internal electrical structure of the substrate. TSVs are difficult and expensive to produce, so their use greatly increases the cost of the completed device. Finally, when combining a semiconductor substrate with a PCB, significant difficulties can arise due to differing coefficients of thermal expansion (CTE) between the components.

SUMMARY OF THE INVENTION

A need exists for a semiconductor device having integrated passive devices with additional IC chips coupled to the device. In addition, a need exists for manufacturing techniques for the system as described which reduce process steps and material costs, resulting in shorter cycle time and lower overall cost.

In one embodiment, the present invention is a semiconductor wafer comprising a substrate and first insulating layer formed over the substrate. An IPD is formed over the first insulating layer. The IPD includes a first conductive layer formed over the first insulating layer, dielectric layer formed over the first conductive layer, and second conductive layer formed over the dielectric layer. A second insulating layer is formed over the IPD. A plurality of first electrical components is mounted over the second insulating layer. An encapsulant is deposited over the second insulating layer and first electrical components. The encapsulant has a CTE matching a CTE of the first electrical components.

In another embodiment, the present invention is a semiconductor device comprising a first insulating layer and IPD formed over the first insulating layer. A second insulating layer is formed over the IPD. A first electrical component is mounted over the second insulating layer. An encapsulant is deposited over the second insulating layer and first electrical component. The encapsulant has a CTE matching a CTE of the first electrical component.

In another embodiment, the present invention is a semiconductor device comprising a first insulating layer and IPD formed over the first insulating layer. A second insulating layer is formed over the IPD. A first electrical component is mounted over the second insulating layer. An encapsulant is deposited over the second insulating layer and first electrical component.

In another embodiment, the present invention is a semiconductor device comprising an IPD and insulating layer formed over the IPD. A first electrical component is mounted over the insulating layer. An encapsulant is deposited over the insulating layer and first electrical component.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor device having integrated passive devices and connected integrated circuit (IC) chips can be manufactured. Moreover, the semiconductor device can be manufactured using a shorter process, using less costly materials which contribute to shorter manufacturing time and lower overall cost. In one embodiment, passive devices can be combined with flash memory ICs and surface acoustic wave (SAW) filter chips to form a system in a package. A variety of different passive components, active components, and integrated circuit devices can be interconnected, however, to suit a particular application.

Figure 1:
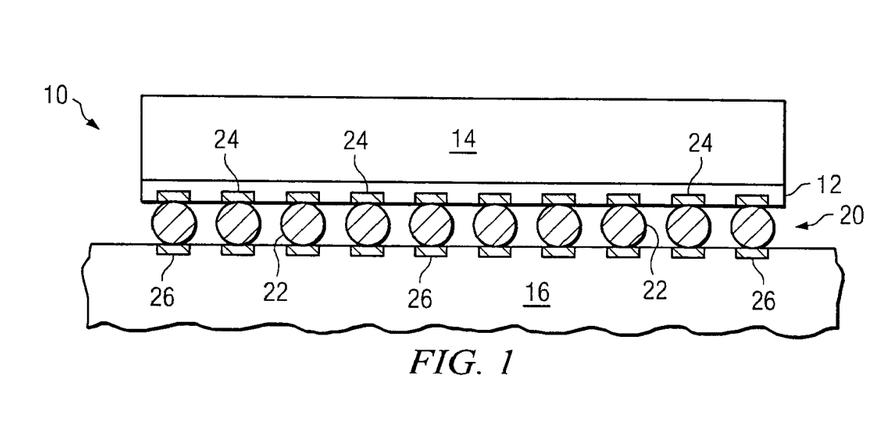
FIG. 1 illustrates an example semiconductor device.

A mounted semiconductor device is shown in FIG. 1. The semiconductor device involves mounting an active area 12 of die 14 face down toward a chip carrier substrate or printed circuit board (PCB) 16. Active area 12 may contain active and passive devices, conductive layers, and dielectric layers according to the electrical design of the die 14. The electrical and mechanical interconnect between die 14 and substrate or PCB 16 is achieved through a solder bump structure 20 comprising a large number of individual conductive solder bumps or balls 22. The solder bumps are formed on bump pads or interconnect sites 24, which are disposed on active area 12 of die 14. The bump pads 24 connect to the active circuits of die 14 by conduction tracks formed in active area 12. The solder bumps 22 are electrically and mechanically connected to contact pads or interconnect sites 26 on carrier substrate or PCB 16 by a solder reflow process. The semiconductor device provides a short electrical conduction path from the active devices on die 14 to conduction tracks on carrier substrate or PCB 16 in order to reduce signal propagation, lower capacitance, and achieve overall better circuit performance.

Figure 2A:
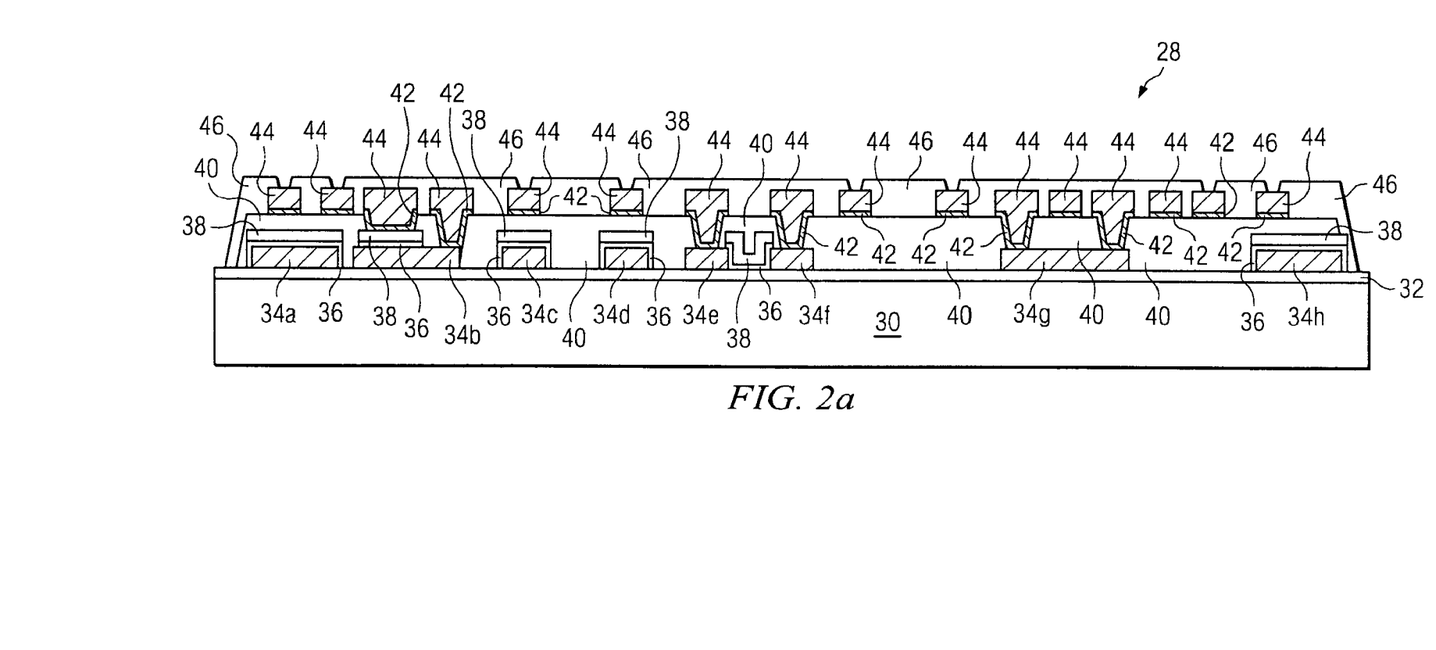
FIGS. 2a-2d illustrate a process of forming a semiconductor device with integrated passive devices.

Turning to FIG. 2a, a first step in manufacturing a system in a package with integrated thin film devices, surface-mounted devices, and PCB-based devices is shown. Semiconductor wafer 28 has substrate 30, over which insulation layer 32 is disposed. Substrate 30 generally includes a dummy wafer or substrate material such as a sacrificial silicon (Si) wafer or any other suitable glass wafer. Accordingly, substrate 30 uses cheaper materials than conventional substrates and can therefore be sacrificed during manufacture. The insulation layer 32 is an optional layer. When present, it allows substrate 30 to be electrically isolated from the other layers of wafer 28. Insulation layer 32 can also act as an etch stop layer. As such, during removal of substrate 30, insulation layer 32 can be used to detect an end-point of substrate 30 to prevent damage to the components formed over substrate 30 and insulation layer 32. Insulation layer 32 can include any suitable material and can be formed in multiple layers. For example, it may include layers of silicon dioxide (SiO2), silicon nitride (Si3N4), silicon oxy-nitride (SiON), polyimide, benzocyclobutene (BCB), polybenzoxazoles (PBO), or any other material with good selectivity for silicon etchant. The deposition of insulation layer 32 may involve physical vapor deposition (PVD), chemical vapor deposition (CVD), or spin coating.

A conductive layer 34a-34g is deposited and patterned over insulation layer 32. Conductive layer 34 forms terminals of various integrated passive devices including a capacitor (34b), resistor (34e and 34f), and inductor (34g). In alternative embodiments, additional system components or passive devices such as transistors, diodes or other dissipative and energy-neutral devices can be formed. Conductive layer 34 can be made with aluminum (Al), aluminum alloys, copper (Cu), nickel (Ni), gold (Au), silver (Ag), salicide, polysilicon, or other electrically conductive material suitable for deposition on a substrate. A PVD, CVD, electrolytic plating, or electroless plating process can be used to form conductive layer 34.

Resistive layer 36 is formed over conductive layer 34 and insulation layer 32. Resistive layer 36 can be any suitable material, including nickel-chromium (NiCr), metal silicide, tantalum nitride (TaN), and polysilicon having high electrical resistance. The deposition of resistive layer 36 may involve PVD or CVD.

A dielectric or insulating layer 38 is patterned and formed over resistive layer 36. Dielectric layer 38 forms parts of various passive circuit elements including a capacitor, resistor, and inductor, and supporting contact pads 34a and 34h. Dielectric layer 38 can be silicon nitride (SiN), tantalum oxide (Ta2O5), hafnium oxide (HfO2), or a dielectric film material. In an alternative embodiment, resistive layer 36 is formed over dielectric layer 38.

Next, passivation layer 40 is deposited over insulation layer 32, conductive layer 34, resistive layer 36, and dielectric layer 38. Passivation layer 40 can be patterned to create various openings, thereby exposing one or more of the lower layers of wafer 28. In FIG. 2a, passivation layer 40 is patterned and etched to expose portions of conductive layer 34 and dielectric layer 38. Passivation layer 40 can include any suitable insulation material such as polyimide, benzocyclobutene (BCB), PBO (polybenzoxazoles), epoxy based insulating polymer, or other insulating polymer materials. Passivation layer 40, like all further passivation layers, provides physical support to and electrical insulation between the layers of wafer 28.

Conductive layer 42 is deposited over passivation layer 40. Conductive layer 42, like conductive layer 34, may include any suitable material and be formed by any suitable method. As shown on FIG. 2a, by virtue of the patterns formed in passivation layer 40, conductive layer 42 contacts portions of conductive layer 34 and dielectric layer 38. In alternative embodiments, passivation layer 40 can be etched so that conductive layer 42 also contacts resistive layer 36. Conductive layer 42 acts as an adhesion layer to facilitate deposition of conductive layer 44 onto wafer 28. In an alternative embodiment, a diffusion barrier material can be deposited between conductive layer 42 and conductive layer 44 to enhance the physical and/or electrical connection between the two layers.

Conductive layer 44 is patterned and formed over conductive layer 42. Conductive layer 44, like conductive layer 34, may include any suitable material and be formed by any suitable process. In one embodiment, for example, conductive layer 42 includes titanium (Ti) and conductive layer 44 includes Cu.

Finally, passivation layer 46 is formed over conductive layer 44 and all lower layers, as shown on FIG. 2a. Passivation layer 46, like passivation layer 40, may include any suitable material and be formed using any suitable method. Passivation layer 46 provides structure support and can be patterned to expose one or more of the lower layers of wafer 28. For example, in FIG. 2a, passivation layer 46 is etched to expose portions of conductive layer 42 and conductive layer 44.

Depending upon the application, the device can be made using different combinations of metal, dielectric, insulator, and passivation layers. For example, some applications may require that additional metal and dielectric layers be formed on wafer 28, or that some be removed. Also, one or more ground planes can be formed on wafer 28 during the fabrication process. Similarly, additional interconnection capability for the device may be achieved by the addition of patterned metal interconnection layers.

In alternative embodiments, capacitors can be formed in the device using a metal-insulator-metal (MIM) configuration. In that case, two single metal layers can be formed over substrate 30 having a dielectric layer disposed between. Additional resistive layers can also be formed between the two metal layers to alter the properties of the capacitors. In one example, plasma deposited SiN, Ta2O3, or anodized aluminum oxide films are deposited between the metal layers and may greatly increase the capacitance of the device.

In FIG. 2a, the integrated passive devices include a capacitor formed by conductive layers 44 and 42, dielectric layer 38, resistive layer 36, and conductive layer 34b. The integrated passive devices further include a resistor formed by conductive layers 34e, resistive layer 36, and conductive layer 34f. The integrated passive devices further include an inductor formed by conductive layers 44, 42, and 34g. The inductor can be formed on wafer 28 as single-layer or stacked spiral inductor components. Generally, stacked spiral inductors provide a higher inductance/unit area, however a single-layer spiral inductor provides a better Q value. A spiral inductor can be formed in as few as two metal layers with an insulative layer disposed in between. First, a spiral design is patterned in the first metal layer and an inner portion of the spiral is electrically coupled to the second metal layer using a via formed through the insulative layer. In such an inductor, the metal layers can be formed from high-conductivity metals such as Cu, Ag, or Au. One or more the integrated passive devices can be interconnected as a passive circuit according to the electrical function of the device.

The etched portions of passivation layer 46 allow for additional system components to connect to wafer 28. The additional system components can be coupled to wafer 28 using any suitable mounting mechanism such as surface mount technology or flip-chip connection methods. For example, with reference to FIG. 2b, discrete passive device 48, base band IC 52, radio frequency IC (RFIC) 58 and SAW filter 64 are each connected to conductive layer 44 via bumps 50, 54, 60, and 66, respectively. Using this method, any combination of passive devices, active devices, discrete passive devices, semiconductor die, other IC chips, or discrete packages can be connected to wafer 28.

Figure 2B:
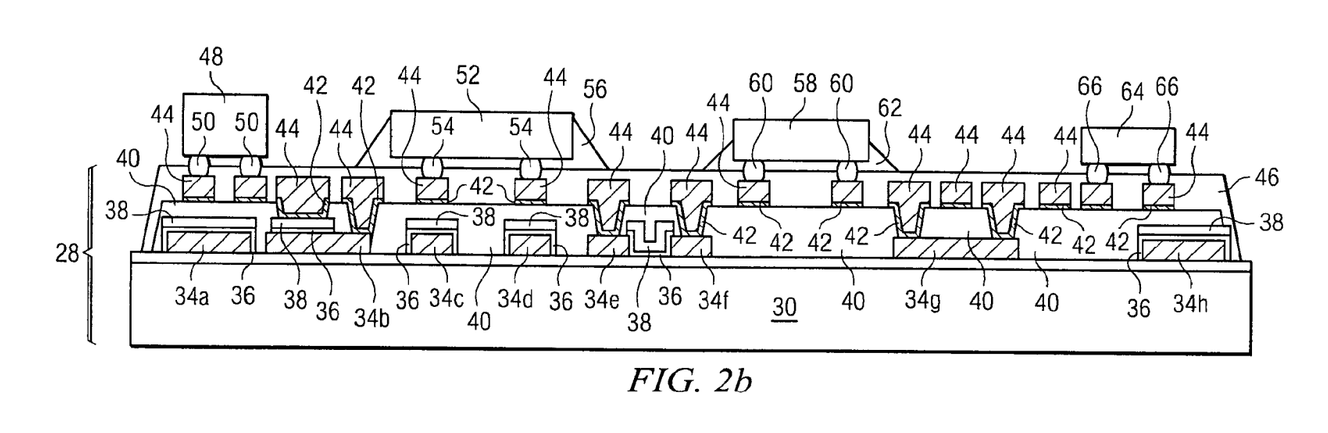

Bumps 50, 54, 60, and 66 form an electrical and mechanical interconnect between components 48, 52, 58, and 64 and wafer 28 and, specifically, between components 48, 52, 58, and 64 and conductive layer 44. Bumps 50, 54, 60, and 66 are formed by a reflow process applied to solder material deposited upon the exposed portions of conductive layer 44 and the contact pads of components 48, 52, 58, and 64. In alternative embodiments, bumps 50, 54, 60, and 66 are formed from Au, or Cu structures or any other suitable material such as tin/lead (Sn/Pb), Copper/Zinc (CuZn), or Copper/Silver (CuAg) solder, each containing an optional flux material. Bumps 50, 54, 60, and 66 can be electrically connected to any of the passive devices formed within the semiconductor device via any suitable interconnect structure.

In one embodiment, under bump metallization (UBM) layers can be added to conductive layer 44 proximate to the openings formed in passivation layer 46 to facilitate installation of bumps 50, 54, 60, and 66. The UBM layers can be formed by any suitable process, including first etching a portion of conductive layer 44 and then applying one or more metal layers to conductive layer 44 using a vacuum deposition by evaporation or sputtering process or a chemical plating process. The UBM layers may include any suitable material such as Ti, nickel vanadate (NiV), or Cu having thicknesses of approximately 1000 Å, 3250 Å, and 8000 Å, respectively. For copper, the etchant can be A70 with about 11.15% nitric acid (HNO3) and 6.3% acetic acid (CH3COOH). Alternatively, the etchant can be A75 with about 75.7% phosphoric acid (H3PO4) and 7.35% acetic acid (CH3COOH). The etchant for titanium can be 1.67% hydrogen fluoride with 1.67% hydrogen peroxide and remaining water. In an alternative embodiment, the UBM layers can be electroless plated nickel-gold (Ni/Au).

Additional stability can be provided to components 48, 52, 58, and 64 by providing an optional underfill material 56 and 62. Underfill material 56 and 62 may include epoxy, polymeric material, film, or other non-conductive material. Underfill material 56 and 62 is applied after bumps 50, 54, 60, and 66 are formed between components 48, 52, 58, and 64 and conductive layer 44 or optional UBM layers. Generally, underfill material 56 and 62 includes an electrically-insulating adhesive material. Underfill material 56 and 62 provides mechanical support to components 52, and 58, and also bumps 54, and 60. Underfill material 56 and 62 can also act as a heat bridge between wafer 28 and components 52 and 58.

In alternative embodiments, a different combination of passive devices and IC chips can be coupled to wafer 28. For example, some applications may require that one or more discrete packages be coupled to wafer 28. The discrete packages can be coupled to wafer 28 using a flip-chip connection mechanism. Additional support can be provided to the discrete packages by providing an underfill material that is formed between the discrete package and wafer 28, as described above.

Figure 2C:
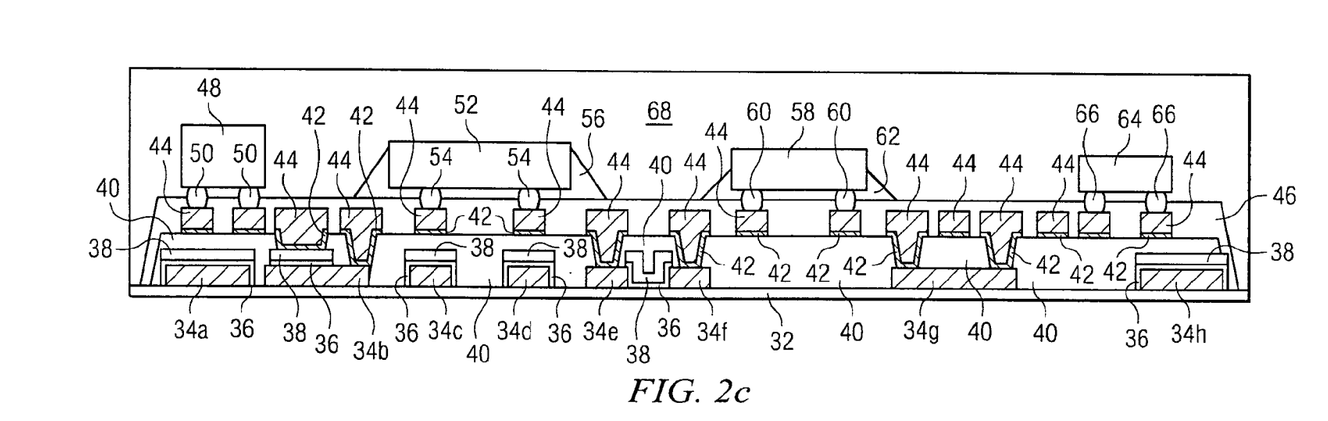

FIG. 2c shows the addition of a molding compound or encapsulant 68 to wafer 28 and removal of substrate 30. Encapsulant 68 may include a plastic material such as epoxy resin-based molding material, or other high-resistivity polymer material that is applied over passivation layer 46, components 48, 52, 58, and 64 and optional underfill material 56 and 62. In an alternative embodiment, encapsulant 68 can be formed with a polymer matrix composite material with a high resistivity. Encapsulant 68 is applied using printing or compressive molding processes. Generally, encapsulant 68 has its coefficient of thermal expansion (CTE) adjusted to match that of components 48, 52, 58, and 64, optional underfill material 56 and 62, and any other material contacted by encapsulant 68. The CTE of encapsulant 68 can be adjusted using a filler such as a powder, fiber, or cloth additive. A suitable encapsulant material is generally characterized by low shrinkage, high resistivity, low dielectric constant, and low loss tangent. Before encapsulant 68 is applied, the wafer can be diced by half cutting along a plurality of saw streets formed in a surface of the wafer. This optional step of dicing the wafer can reduce warpage of the wafer and overall residual stress.

Substrate 30 is removed using a suitable process. For example, substrate 30 can be removed by mechanical back grinding with an additional wet etching step. Alternatively, plasma etching and/or a chemical-mechanical planarization (CMP) process can be used. In the present embodiment, a majority of substrate 30 is initially removed using a back grind process that leaves approximately 10-25 μm of substrate 30 remaining. Then, the remaining substrate 30 is removed using a wet dry, dry etch, or CMP process. After removal of substrate 30, passivation layer 32 is exposed. With substrate 30 removed, the height of wafer 28 from the bottom of passivation layer 32 to the top of encapsulant 68 is approximately 420 μm.

Figure 2D:
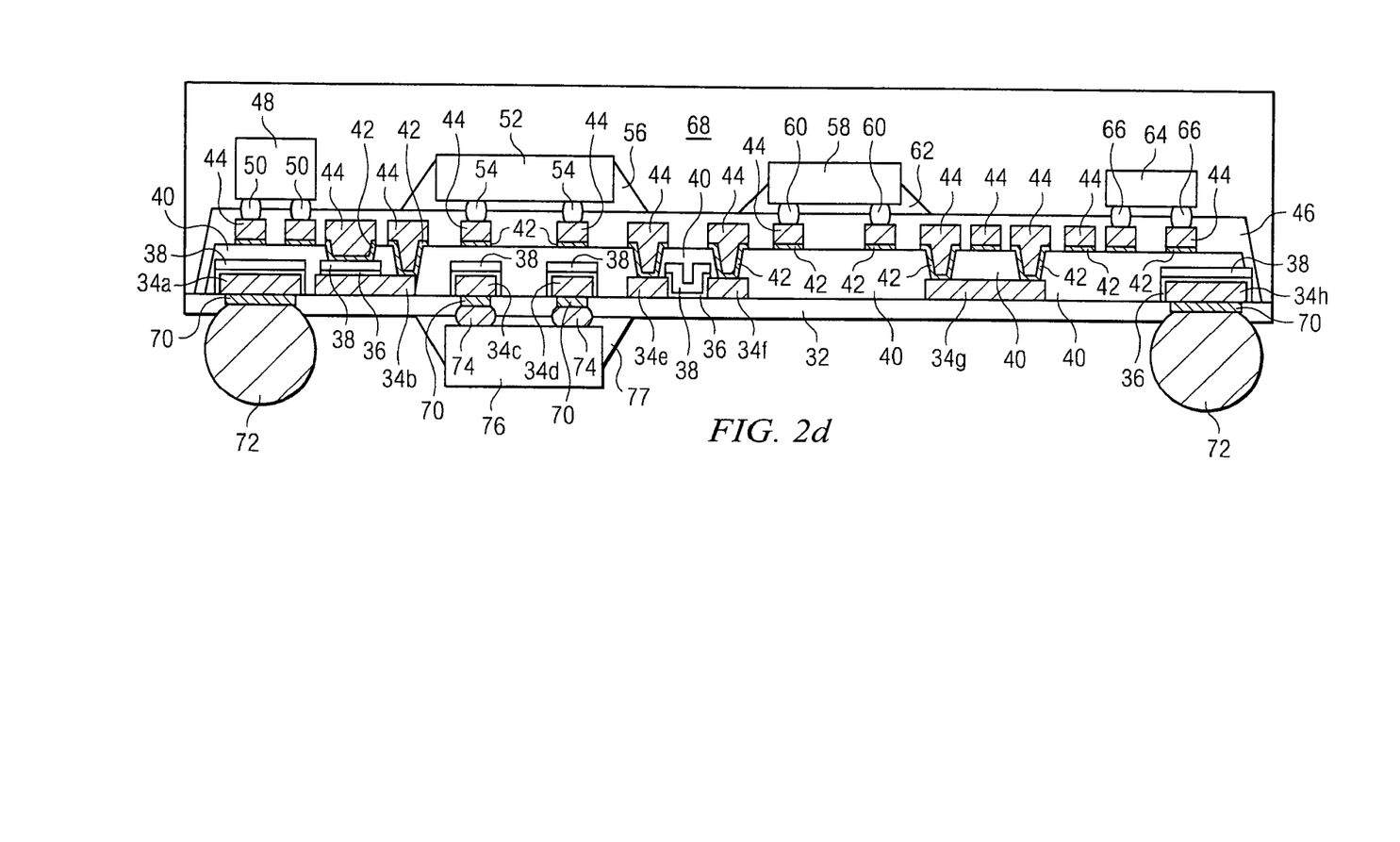

Turning to FIG. 2d, portions of passivation layer 32 are removed thereby creating openings that expose parts of conductive layer 34. Optional UBM layers 70 can be formed on conductive layer 34 at the openings in passivation layer 32. The UBM layers 70 may include any suitable material as described above. Additional components such as memory IC 76 are electrically and mechanically coupled to conductive layer 34 via bumps 74 using a solder reflow process. Bumps 74, however, may comprise any suitable material and be applied using any suitable process as described above. In this manner, any combination of passive devices and/or IC die can be connected to the backside of wafer 28. Note that using this method, IC die and passive devices can be coupled to the backside of wafer 28 directly underneath other passive devices and IC die mounted to the front side of wafer 28. For example, in FIG. 2d, memory IC 76 is mounted directly below base band IC 52. Accordingly, the current method allows for 3D mounting of passive devices and IC die. Bumps 74 may also be configured to electrically connect to passive devices formed within wafer 28. An optional underfill material 77 can be formed beneath memory IC 76, or any other similarly mounted device. Underfill material 77 is generally applied after memory IC 76 is coupled to conductive layer 34 via bumps 74.

Figure 3:
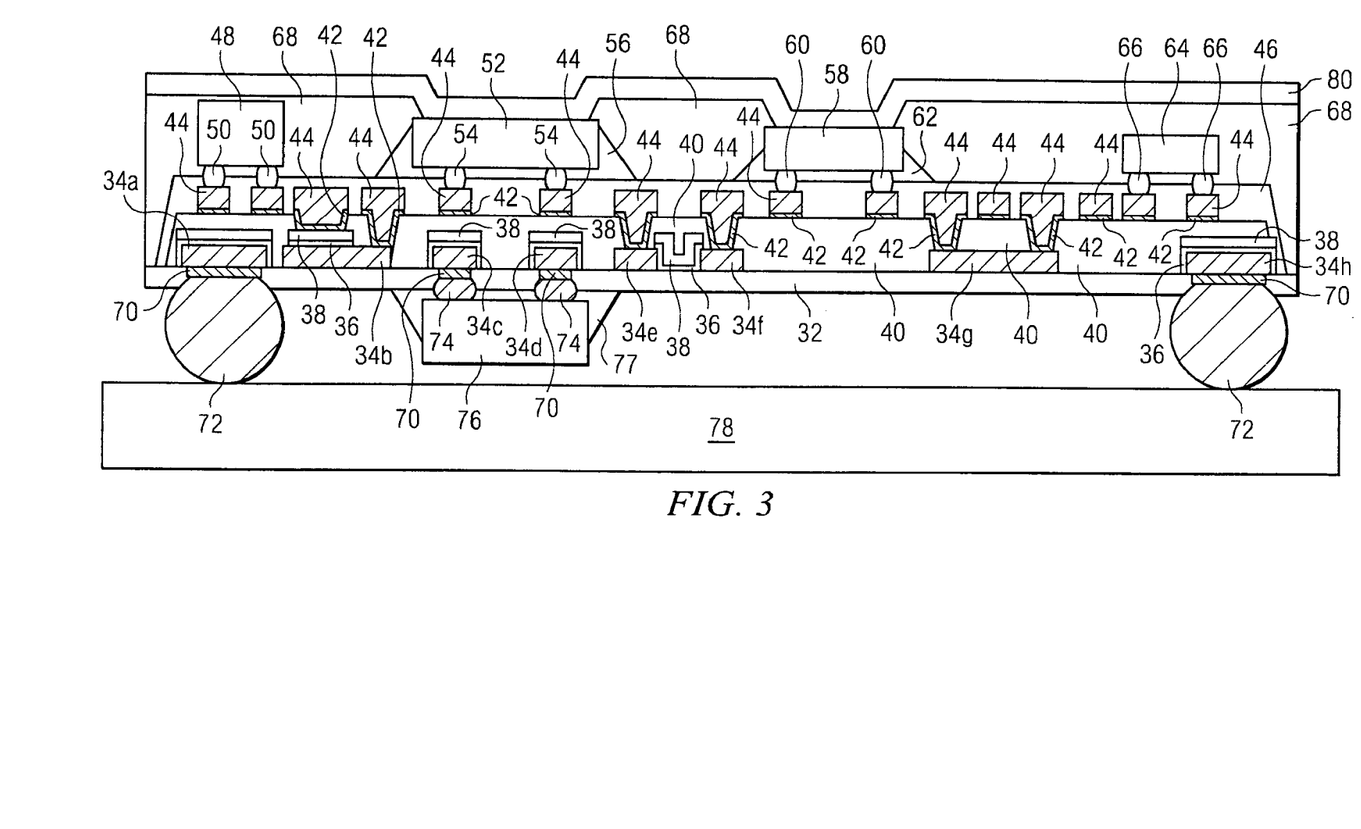
FIG. 3 illustrates a semiconductor device with integrated passive devices and an additional metal layer.

Bumps 72 are coupled to conductive layer 34 to facilitate connection of the semiconductor device to additional components of the system such as PCB 78 (as shown on FIG. 3). Bumps 72 can be formed using a ball drop or stencil printing process. The passive devices electrically connect to contact pads 34a and 34h. Bumps 72 and UBM 70 constitute an interconnect structure for connecting the passive components to external devices.

Turning to FIG. 3, a second embodiment of the semiconductor device is shown. Bumps 72 are electrically and mechanically coupled to PCB 78. Bumps 72 are coupled to PCB 78 by a solder reflow process. In FIG. 3, an optional metal layer 80 is deposited upon encapsulant 68 using a CVD, PVD or plating process. Metal layer 80 provides electromagnetic and physical shielding for the semiconductor device. Metal layer 80 also acts as a heat sink layer by absorbing and discharging heat energy generated by the semiconductor device and can be patterned for specific design requirements.

Figure 4:
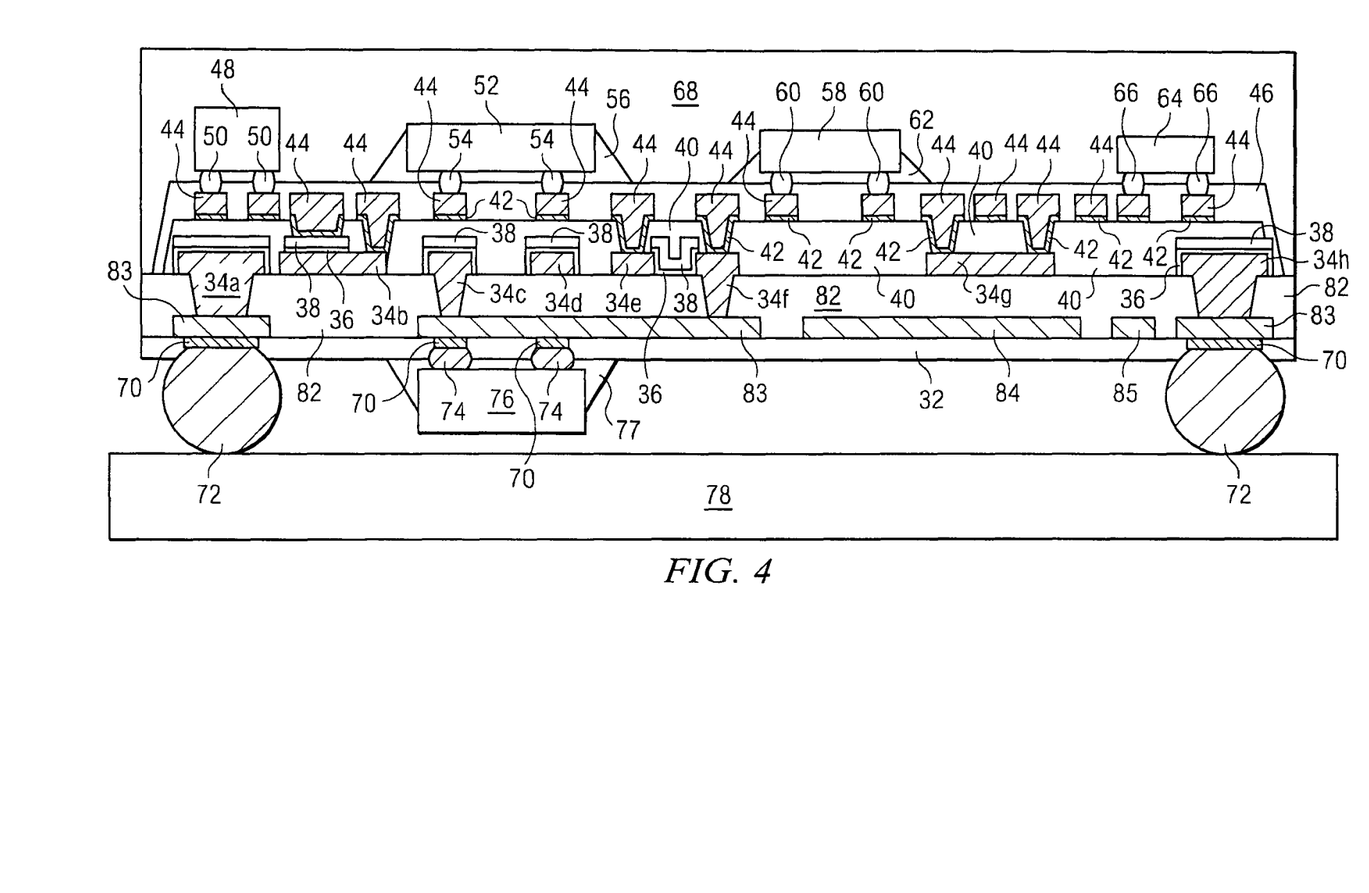
FIG. 4 illustrates a semiconductor device with integrated passive devices and interconnections, a ground plane, and a passivation layer.

FIG. 4 depicts a third embodiment of the semiconductor device having interconnections 83, ground plane 84, strip line 85, and passivation layer 82. These additional layers are depicted in FIG. 4 and can be added to wafer 28 during fabrication. For example, after forming passivation layer 32 over substrate 30, interconnections 83, ground plane 84, and strip line 85 can be formed as a single patterned and etched metal layer that is deposited over passivation layer 32. Then, passivation layer 82 can be formed over that metal layer. Passivation layer 82 is then patterned and etched to expose portions of interconnections 83, ground plane 84, and strip line 85.

Interconnections 83 generally include a metal layer that forms an electrical connection between bumps 72, or 74 and components formed within wafer 28. Interconnections 83 can be formed in any suitable configuration depending upon the system application. For example, in some embodiments, interconnections 83 may only facilitate electronic communication between PCB 78 and the passive components formed within wafer 28. In alternative embodiments, interconnections 83 can also provide connectivity between other connected components such as memory IC 76 and the passive components formed within wafer 28.

Ground plane 84 is a metal layer and provides an electrical ground connection for passive devices formed within wafer 28. Ground plane 84 can also provide an optional ground connection for discrete passive device 48, base band IC 52, radio frequency IC (RFIC) 58, surface acoustic wave (SAW) filter 64, and memory IC 76. Ground plane 84 reduces noise and cross-talk between the passive components, and between the passive components and other components of the semiconductor device.

Transmission line or strip line 85 includes a metal material and acts as a transmission line by absorbing and emitting electromagnetic radiation. Accordingly, strip line 85 facilitates signal matching, signal transmission and further ensures radio frequency (RF) signal integrity of the system. Strip line 85 can be created in any suitable configuration. Generally, strip line antennas comprise a strip of metal formed between two parallel ground planes. A dielectric material is disposed between the ground planes and around the metal strip. The geometric properties of the metal strip, the distance between the strip and the ground planes and the relative permittivity of the dielectric material determine the characteristic impedance of the transmission line. Alternatively, strip line 85 can be in the form of a microstrip antenna. In such a configuration, strip line 85 comprises a metal strip separated from a single ground plane by a dielectric material.

Passivation layer 82 provides mechanical support to the different layers in wafer 28. Passivation layer 82 includes any suitable passivation material as described above.

Figure 5:
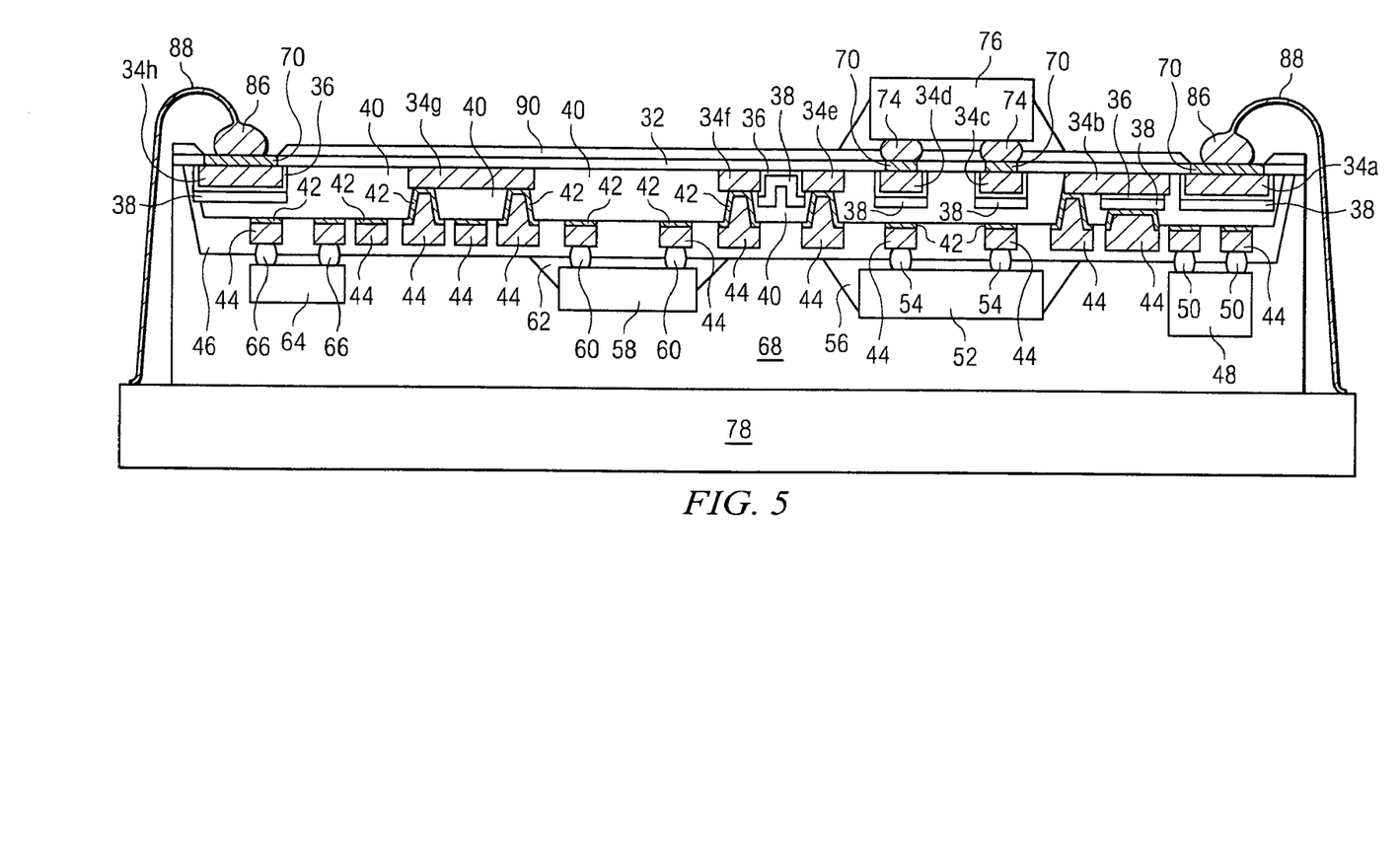
FIG. 5 illustrates a semiconductor device with integrated passive devices and connected wire bonds.

FIG. 5 depicts a fourth embodiment of the semiconductor device. After substrate 30 is removed from FIG. 2d and portions of passivation layer 32 are removed to create openings that expose parts of conductive layer 34. UBM layers 70 are formed on conductive layer 34 at the openings in passivation layer 32. The UBM layers 70 include any suitable material and can be deposited using any suitable process as described above.

The semiconductor device is inverted and encapsulant 68 is mounted to PCB 78, for example by an adhesive material. Wire bond (WB) pads 86 are mounted to optional UBM layers 70 using a suitable welding process. Alternatively, WB pads 86 can be coupled directly to conductive layer 34. WB pads 86 are coupled to UBM layers 70 using a process that combines heat, pressure, and/or ultrasonic energy to form a mechanical and electrical bond between WB pads 86 and UBM layers 70. WB pads 86 may include Au, Al, or Cu material. The combination of conductive layer 34, resistive layer 36, and dielectric layer 38 facilitate the coupling of WB pads 86 to UBM layers 70 by providing a harden layer. The harden layer is located underneath wire bonding pads and presents an enhanced wire bonding process window. WB leads 88 are electrically and mechanically coupled to WB pads 88.

Figure 6:
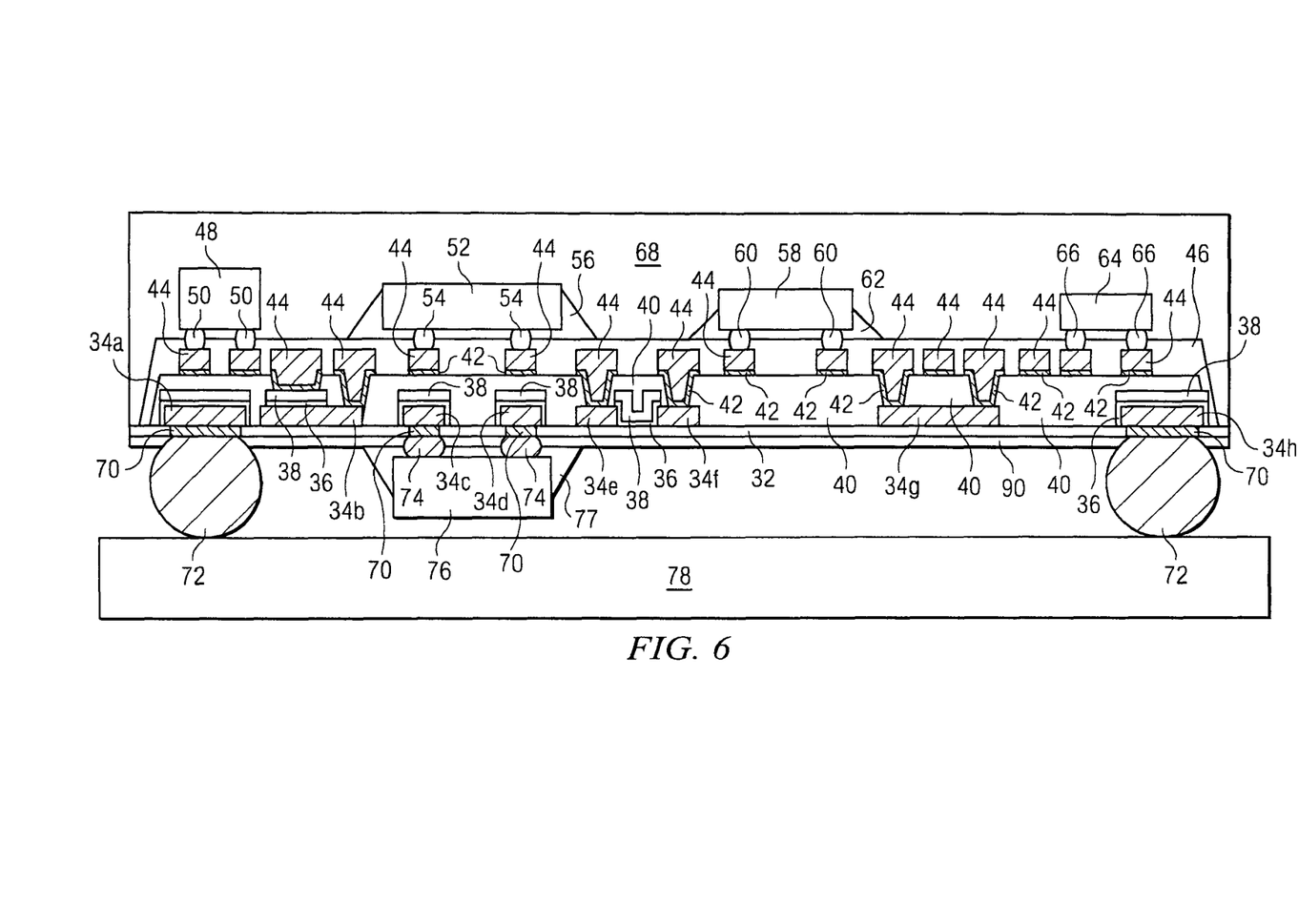
FIG. 6 illustrates a semiconductor device with integrated passive devices and an etch stop layer.

FIG. 6 depicts a fifth embodiment of the semiconductor device. During manufacture of the semiconductor device, etch stop layer 90 is deposited upon substrate 30 before passivation layer 32 and thereby resides between substrate 30 and passivation layer 32. During etching and removal of substrate 30, etch stop layer 90 facilitates detection of the end-point of substrate 30, protecting conductive layer 34. Etch stop layer 90 can be a single layer of material such as Si3N4, or may include a multilayer material such as one with layers of Si3N4 and SiO2.

Figure 7:
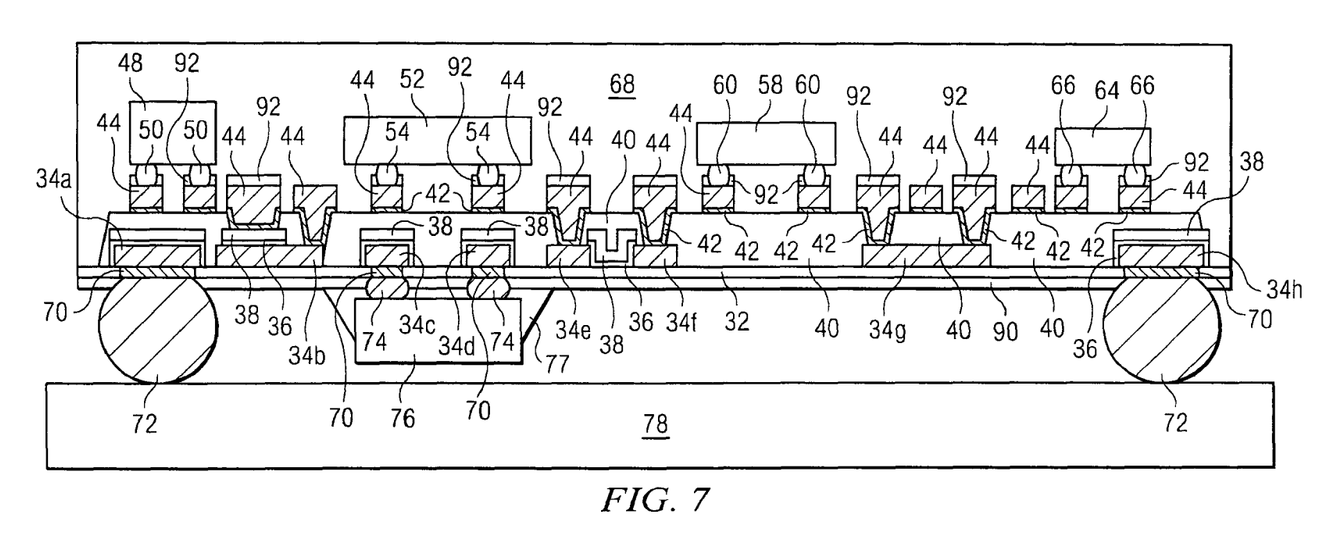
FIG. 7 illustrates a semiconductor device with integrated passive devices and an additional conductive layer.

Turning to FIG. 7, a sixth embodiment of the semiconductor device is depicted. In the present embodiment, passivation layer 46 is not present on wafer 28. Passivation layer 46 can either be removed, or is not applied during fabrication of wafer 28. Conductive layer 92 is deposited upon conductive layer 44. Conductive layer 92 is patterned to further define solder bump connection locations formed in conductive layer 44 and to facilitate formation of bumps 50, 54, 60, and 66 for connecting conductive layer 44 to components 48, 52, 58, and 64. In FIG. 7, conductive layer 92 is patterned and deposited to define a perimeter of the solder bump connection locations for bumps 50, 54, 60, and 66. Although not depicted, conductive layer 92 can also be used to further define solder bump connection points on the backside of the wafer, for example over UBM layers 70 (as shown on FIG. 2d).

Semiconductor devices in the various embodiments shown can be manufactured using tools and equipment commonly known in the art, such as wire bonding, patterning, etching and similar equipment. Semiconductor devices serve to continue to advance integrated passive device technology at reduced fabrication cost, while resulting in larger overall repeatable quality.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first insulating layer including first and second opposing surfaces;
   a first conductive layer formed over the first surface of the first insulating layer;
   a dielectric layer formed over the first conductive layer;
   a second conductive layer formed over the dielectric layer and electrically isolated from the first conductive layer by the dielectric layer, wherein the first and second conductive layers and dielectric layer constitute a capacitor;
   a second insulating layer formed over the first insulating layer and second conductive layer;
   a plurality of first electrical components disposed over the second insulating layer;
   a second electrical component disposed over the second surface of the first insulating layer; and
   an encapsulant deposited in contact with the second insulating layer and the first electrical components, the encapsulant including a coefficient of thermal expansion (CTE) matching a CTE of the first electrical components.

2. The semiconductor device of claim 1, wherein the first electrical components are selected from the group consisting of a discrete passive device, discrete semiconductor device, radio frequency integrated circuit, baseband integrated circuit, and semiconductor die.

3. The semiconductor device of claim 1, further including a shielding layer formed over the encapsulant.

4. The semiconductor device of claim 1, further including a heat sink formed over the encapsulant.

5. A semiconductor device, comprising:
   a first insulating layer including first and second opposing surfaces;
   an integrated passive device (IPD) formed and patterned over the first surface of the first insulating layer;
   a second insulating layer formed over the IPD;
   a first electrical component disposed over the second insulating layer; and
   an encapsulant deposited in contact with the second insulating layer and the first electrical component, the encapsulant including a coefficient of thermal expansion (CTE) matching a CTE of the first electrical component.

6. The semiconductor device of claim 5, wherein the IPD includes:
   a first conductive layer formed over the first surface of the first insulating layer;
   a third insulating layer formed over the first conductive layer; and
   a second conductive layer formed over the third insulating layer and electrically isolated from the first conductive layer by the third insulating layer, wherein the first and second conductive layers and third insulating layer constitute a capacitor.

7. The semiconductor device of claim 5, wherein the IPD includes an inductor, capacitor, or resistor.

8. The semiconductor device of claim 5, wherein the first electrical component is selected from the group consisting of a discrete passive device, discrete semiconductor device, radio frequency integrated circuit, baseband integrated circuit, and semiconductor die.

9. The semiconductor device of claim 5, further including a second electrical component disposed over the second surface of the first insulating layer opposite the first surface.

10. The semiconductor device of claim 5, further including a metal layer formed over the encapsulant.

11. The semiconductor device of claim 5, wherein the IPD includes a conductive layer formed over the first surface of the first insulating layer and wound to exhibit an inductive property.

12. A semiconductor device, comprising:
    a first insulating layer;
    an integrated passive device (IPD) formed and patterned over a first surface of the first insulating layer;
    a second insulating layer formed over the IPD;
    a first electrical component disposed over the second insulating layer; and
    an encapsulant deposited over the second insulating layer and the first electrical component.

13. The semiconductor device of claim 12, wherein the encapsulant includes a coefficient of thermal expansion (CTE) matching a CTE of the first electrical component.

14. The semiconductor device of claim 12, wherein the first electrical component is selected from the group consisting of a discrete passive device, discrete semiconductor device, radio frequency integrated circuit, baseband integrated circuit, and semiconductor die.

15. The semiconductor device of claim 12, wherein the IPD includes an inductor, capacitor, or resistor.

16. The semiconductor device of claim 12, further including a second electrical component disposed over a second surface of the first insulating layer.

17. The semiconductor device of claim 12, further including:
    a printed circuit board including a contact pad, wherein the encapsulant is disposed over the printed circuit board; and
    a bond wire electrically connected between the IPD and the contact pad of the printed circuit board.

18. A semiconductor device, comprising:
    an integrated passive device (IPD);
    a first insulating layer formed over a first surface of the IPD;
    a first electrical component disposed over the first insulating layer;
    a second electrical component disposed over a second surface of the IPD opposite the first surface; and
    an encapsulant deposited in contact with the first insulating layer and the first electrical component.

19. The semiconductor device of claim 18, wherein the encapsulant includes a coefficient of thermal expansion (CTE) matching a CTE of the first electrical component.

20. The semiconductor device of claim 18, wherein the IPD includes an inductor, capacitor, or resistor.

21. The semiconductor device of claim 18, further including a metal layer formed over the encapsulant.

22. The semiconductor device of claim 18, further including an interconnect structure formed over a surface of the semiconductor device opposite the first electrical component, the interconnect structure being electrically connected to the IPD.

23. A semiconductor device, comprising:
a first insulating layer;
an integrated passive device (IPD) formed over a first surface of the first insulating layer;
a second insulating layer formed over the IPD;
a first electrical component disposed over the second insulating layer;
and
an encapsulant deposited in contact with the second insulating layer and the first electrical component.

24. The semiconductor device of claim 23, wherein the IPD includes an inductor, capacitor, or resistor.

25. The semiconductor device of claim 23, further including an interconnect structure formed through the first insulating layer.

26. The semiconductor device of claim 23, wherein the encapsulant includes a coefficient of thermal expansion (CTE) matching a CTE of the first electrical component.

27. The semiconductor device of claim 23, wherein the IPD is formed and patterned over the first surface of the first insulating layer.

28. The semiconductor device of claim 23, further including a second electrical component disposed over a second surface of the first insulating layer.

29. The semiconductor device of claim 23, wherein the IPD includes:
a first conductive layer formed over the first surface of the first insulating layer;
a third insulating layer formed over the first conductive layer; and
a second conductive layer formed over the third insulating layer and electrically isolated from the first conductive layer by the third insulating layer, wherein the first and second conductive layers and third insulating layer constitute a capacitor.

30. The semiconductor device of claim 23, wherein the IPD includes a conductive layer wound to exhibit an inductive property.

31. The semiconductor device of claim 12, wherein the IPD includes:
a first conductive layer formed over the first surface of the first insulating layer;
a third insulating layer formed over the first conductive layer; and
a second conductive layer formed over the third insulating layer and electrically isolated from the first conductive layer by the third insulating layer, wherein the first and second conductive layers and third insulating layer constitute a capacitor.

32. The semiconductor device of claim 12, wherein the IPD includes a conductive layer wound to exhibit an inductive property.

33. The semiconductor device of claim 18, wherein the IPD is formed and patterned over the first surface of the first insulating layer.

34. The semiconductor device of claim 18, wherein the IPD includes:
a first conductive layer;
a second insulating layer formed over the first conductive layer; and
a second conductive layer formed over the third insulating layer and electrically isolated from the first conductive layer by the second insulating layer, wherein the first and second conductive layers and second insulating layer constitute a capacitor.

35. The semiconductor device of claim 18, wherein the IPD includes a conductive layer wound to exhibit an inductive property.

* * * * *